US010727062B2

(12) United States Patent
Violette et al.

(10) Patent No.: US 10,727,062 B2
(45) Date of Patent: Jul. 28, 2020

(54) METHODS OF FORMING INTEGRATED CIRCUIT WELL STRUCTURES

(71) Applicant: MICRON TECHNOLOGY, INC., Boise, ID (US)

(72) Inventors: Michael Violette, Boise, ID (US); Vladimir Mikhalev, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/892,584

(22) Filed: Feb. 9, 2018

(65) Prior Publication Data

US 2019/0206688 A1 Jul. 4, 2019

Related U.S. Application Data

(60) Provisional application No. 62/611,694, filed on Dec. 29, 2017.

(51) Int. Cl.

*H01L 21/266* (2006.01)
*H01L 21/265* (2006.01)
*H01L 29/10* (2006.01)
*H01L 29/66* (2006.01)
*H01L 21/027* (2006.01)

(Continued)

(52) U.S. Cl.

CPC ...... *H01L 21/266* (2013.01); *H01L 21/26513* (2013.01); *H01L 29/1095* (2013.01); *H01L 29/66825* (2013.01); *H01L 29/66833* (2013.01); *G11C 16/0483* (2013.01); *G11C 16/08* (2013.01); *H01L 21/0274* (2013.01); *H01L 27/1157* (2013.01); *H01L 27/11524* (2013.01);

(Continued)

(58) Field of Classification Search

CPC ..... H01L 21/823493; H01L 21/823892; H01L 2027/11861; H01L 31/035236; H01L 27/0925; H01L 27/0927; H01L 29/803; H01L 23/043; H01L 29/122; H01L 29/7782; H01L 29/7801; H01L 21/266; H01L 21/26513; H01L 29/1095; H01L 29/66833; H01L 29/66825; H01L 27/11582; H01L 27/11556; H01L 27/11524; H01L 21/0274; H01L 27/1157; G11C 16/0483

See application file for complete search history.

(56) References Cited

U.S. PATENT DOCUMENTS

2003/0222272 A1* 12/2003 Hamerski ........... H01L 27/0814 257/106
2007/0054451 A1* 3/2007 Tanaka ............. H01L 21/26513 438/257

(Continued)

*Primary Examiner* — Thanh T Nguyen
(74) *Attorney, Agent, or Firm* — Dicke, Billig & Czaja, PLLC

(57) ABSTRACT

Methods of forming a portion of an integrated circuit include forming a patterned mask having an opening and exposing a surface of a semiconductor material, forming a first doped region at a first level of the semiconductor material through the opening, and isotropically removing a portion of the patterned mask to increase a width of the opening. The methods further include forming a second doped region at a second level of the semiconductor region through the opening after isotropically removing the portion of the patterned mask, wherein the second level is closer to the surface of the semiconductor material than the first level.

20 Claims, 16 Drawing Sheets

(51) Int. Cl.

| | |
|---|---|
| *H01L 27/11524* | (2017.01) |
| *H01L 27/1157* | (2017.01) |
| *H01L 27/11556* | (2017.01) |
| *H01L 27/11582* | (2017.01) |
| *G11C 16/04* | (2006.01) |
| *G11C 16/08* | (2006.01) |

(52) U.S. Cl.
CPC ... *H01L 27/11556* (2013.01); *H01L 27/11582* (2013.01)

(56) References Cited

U.S. PATENT DOCUMENTS

2013/0334591 A1 12/2013 Matsuda
2017/0103894 A1* 4/2017 Aichinger ........... H01L 21/3065

* cited by examiner

METHODS OF FORMING INTEGRATED CIRCUIT WELL STRUCTURES

RELATED APPLICATION

This application claims the benefit of U.S. Provisional Patent Application Ser. No. 62/611,694, filed Dec. 29, 2017 and titled, "METHODS OF FORMING INTEGRATED CIRCUIT WELL STRUCTURES," which is commonly assigned and incorporated by reference herein in its entirety.

TECHNICAL FIELD

The present disclosure relates generally to integrated circuits and, in particular, in one or more embodiments, the present disclosure relates to methods of forming integrated circuit well structures and memory containing such well structures.

BACKGROUND

Integrated circuit devices traverse a broad range of electronic devices. One particular type include memory devices, oftentimes referred to simply as memory. Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

In order for memory manufacturers to remain competitive, memory designers are constantly striving to increase the density of memory devices. Increasing the density of a memory device often involves reducing spacing between circuit elements. However, reduced spacing of circuit elements may hinder effective isolation of adjacent circuit elements.

DETAILED DESCRIPTION

Figure 1:
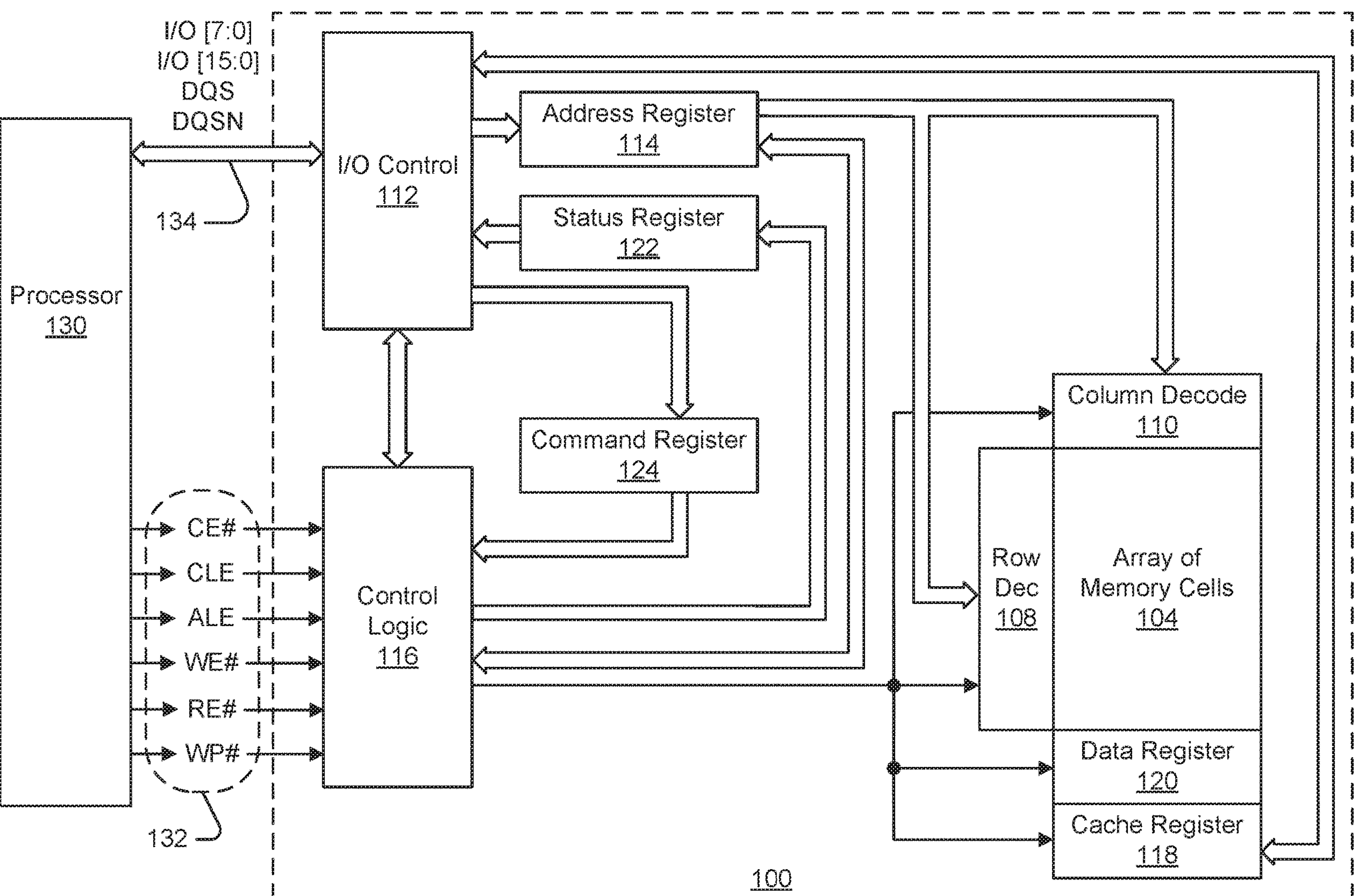
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting unless otherwise apparent from the context.

FIG. 1 is a simplified block diagram of a first apparatus (e.g., an integrated circuit device), in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, cellular telephones and the like. The processor 130, e.g., a controller external to the memory device 100, may be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and generates status information for the external processor 130, i.e., control logic 116 is configured to perform access operations (e.g., read operations, program operations and/or erase operations) and other operations in accordance with embodiments described herein. The control logic 116 is in communication with row decode circuitry 108 and column decode circuitry 110 to control the row decode circuitry 108 and column decode circuitry 110 in response to the addresses.

Control logic 116 may also be in communication with a cache register 118. Cache register 118 may latch data, either incoming or outgoing, as directed by control logic 116 to temporarily store data while the array of memory cells 104 is busy writing or reading, respectively, other data. During a program operation (e.g., write operation), data may be passed from the cache register 118 to data register 120 for transfer to the array of memory cells 104; then new data may be latched in the cache register 118 from the I/O control circuitry 112. During a read operation, data may be passed from the cache register 118 to the I/O control circuitry 112 for output to the external processor 130; then new data may be passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands may be received over input/output (I/O) pins [7:0] of I/O bus 134 at I/O control circuitry 112 and may be written into command register 124. The addresses may be received over input/output (I/O) pins [7:0] of I/O bus 134 at I/O control circuitry 112 and may be written into address register 114. The data may be received over input/output (I/O) pins [7:0] for an 8-bit device or input/output (I/O) pins [15:0] for a 16-bit device at I/O control circuitry 112 and may be written into cache register 118. The data may be subsequently written into data register 120 for programming the array of memory cells 104. For another embodiment, cache register 118 may be omitted, and the data may be written directly into data register 120. Data may also be output over input/output (I/O) pins [7:0] for an 8-bit device or input/output (I/O) pins [15:0] for a 16-bit device. The I/O bus 134 might further include complementary data strobes DQS and DQSN that may provide a synchronous reference for data input and output. Although reference may be made to I/O pins, they may include any conductive node providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2A:
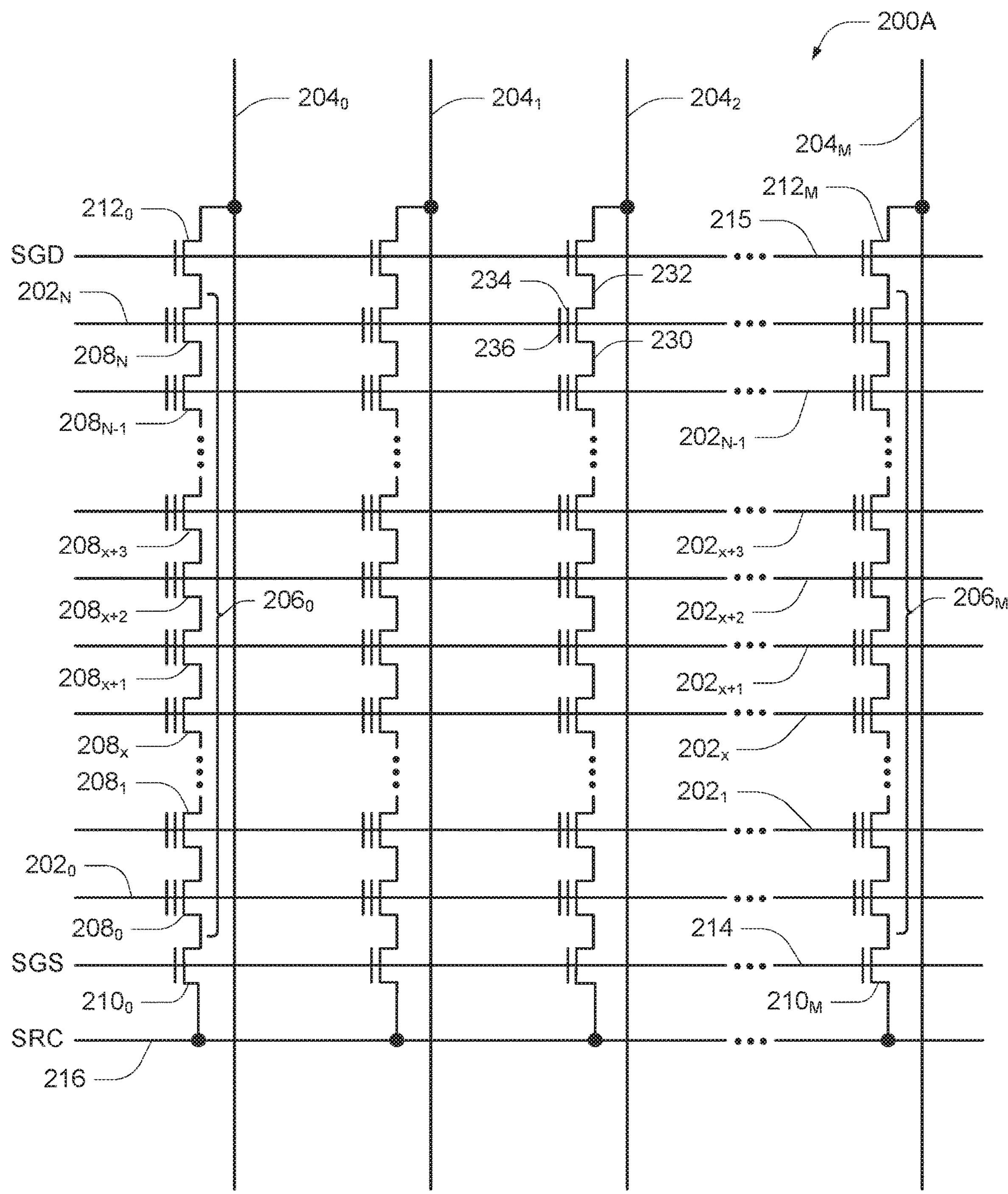
FIGS. 2A-2B are schematics of portions of an array of memory cells as could be used in a memory of the type described with reference to FIG. 1.

FIG. 2A is a schematic of a portion of an array of memory cells 200A as could be used in a memory of the type described with reference to FIG. 1, e.g., as a portion of array of memory cells 104. Memory array 200A includes access lines, such as word lines $\mathbf{202}_0$ to $\mathbf{202}_N$, and data lines, such as bit lines $\mathbf{204}_0$ to $\mathbf{204}_M$. The word lines 202 may be connected to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 may represent non-volatile memory cells for storage of data. The memory cells 208 of each NAND string 206 might be connected in series between a select gate 210 (e.g., a field-effect transistor), such as one of the select gates $210_0$ to $210_M$ (e.g., that may be source select transistors, commonly referred to as select gate source), and a select gate 212 (e.g., a field-effect transistor), such as one of the select gates $212_0$ to $212_M$ (e.g., that may be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 may utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding bit line 204. A control gate of each select gate 212 might be connected to select line 215.

The memory array in FIG. 2A might be a three-dimensional memory array, e.g., where NAND strings 206 may extend substantially perpendicular to a plane containing the common source 216 and to a plane containing a plurality of bit lines 204 that may be substantially parallel to the plane containing the common source 216.

Typical construction of memory cells 208 includes a data-storage structure 234 (e.g., a floating gate, charge trap, etc.) that can determine a data state of the memory cell (e.g., through changes in threshold voltage), and a control gate 236, as shown in FIG. 2A. The data-storage structure 234 may include both conductive and dielectric structures while the control gate 236 is generally formed of one or more conductive materials. In some cases, memory cells 208 may further have a defined source/drain (e.g., source) 230 and a defined source/drain (e.g., drain) 232. Memory cells 208 have their control gates 236 connected to (and in some cases form) a word line 202.

A column of the memory cells 208 may be a NAND string 206 or a plurality of NAND strings 206 selectively connected to a given bit line 204. A row of the memory cells 208 may be memory cells 208 commonly connected to a given word line 202. A row of memory cells 208 can, but need not, include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Figure 2B:
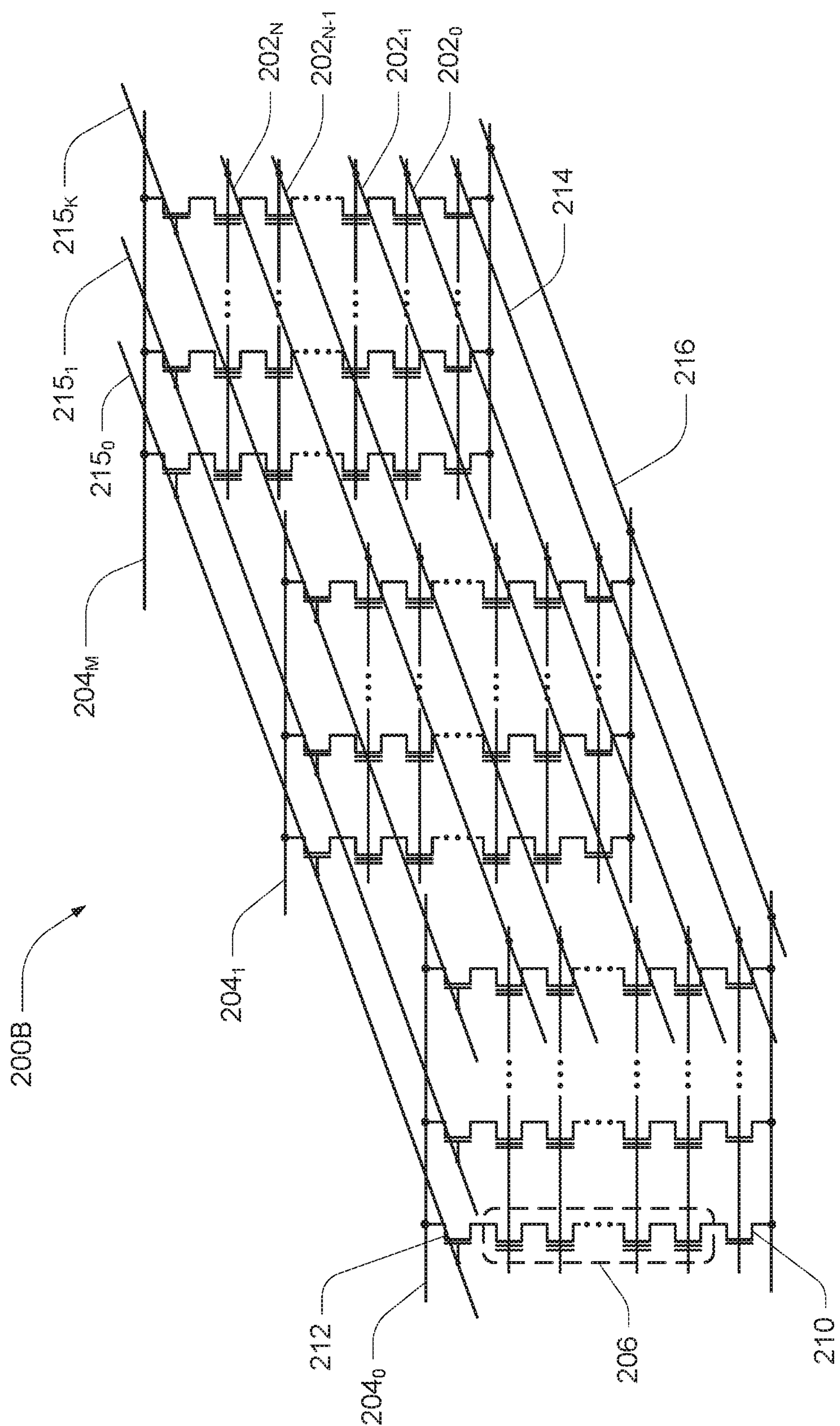

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_K$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Figure 3:
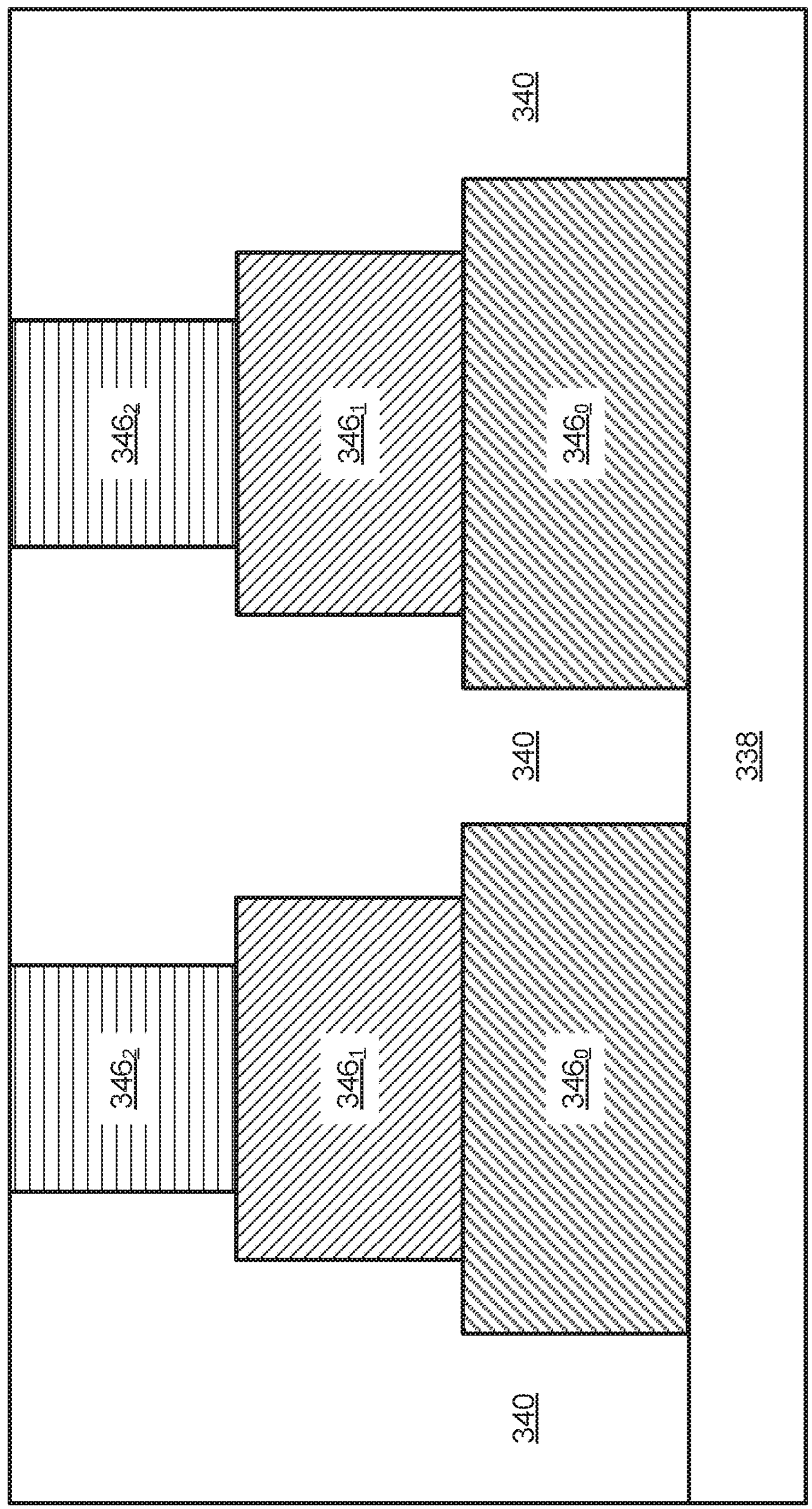
FIG. 3 depicts a related integrated circuit structure.

Various circuit elements may be formed on well structures of varying types and levels of conductivity. FIG. 3 depicts a related integrated circuit structure demonstrating two adjacent well structures and their limitations. In general, a well structure might be formed of one or more regions (e.g., doped regions) of semiconductor material 346 in a semiconductor material 340. One of the regions of semiconductor material 346 (e.g., $\mathbf{346_0}$) is typically formed over, and often in contact with, a region of semiconductor material 338. The region of semiconductor material 338 might have a conductivity type, such as an n-type conductivity. The regions of semiconductor material 346 (e.g., each region of semiconductor material $\mathbf{346_0}$-$\mathbf{346_2}$) might have a conductivity type the same as the conductivity type of the region of semiconductor material 338, such as an n-type conductivity. The semiconductor material 340 might have a conductivity type that is different than (e.g., opposite of) the conductivity type of the semiconductor material 338, such as a p-type conductivity. In combination, the regions of semiconductor material $\mathbf{346_0}$-$\mathbf{346_2}$ and the region of semiconductor material 338 form a contiguous structure often referred to as a tub. The enclosed portion of the semiconductor material 340 between two stacks of the regions of semiconductor material $\mathbf{346_0}$-$\mathbf{346_2}$ in contact with the region of semiconductor material 338, e.g., within the tub, may represent a well having a different conductivity type than the well structures of the regions of semiconductor material 346.

Each of the regions of semiconductor material 346 might be formed by implanting a dopant species into the semiconductor material 340. As is well understood in the art, such implantation generally involves acceleration of ions directed at a surface of the semiconductor material 340. To produce an n-type conductivity, the dopant species might include ions of arsenic (As), antimony (Sb), phosphorus (P) or another n-type impurity. To produce a p-type conductivity, the dopant species might include ions of boron (B) or another p-type impurity.

Each of the regions of semiconductor material 346 might be formed at different implant energy levels. Higher implant energy levels may generally lead to deeper doped regions for a given dopant species. For example, the region of semiconductor material $\mathbf{346_0}$ might be formed at a first implant energy level, the region of semiconductor material $\mathbf{346_1}$ might be formed at a second implant energy level less than the first implant energy level, and the region of semiconductor material $\mathbf{346_2}$ might be formed at a third implant energy level less than the second implant energy level. The region of semiconductor material 338 might be similarly formed, e.g., by implanting a dopant species into the semiconductor material 340, e.g., at a higher implant energy level than is used for any of the regions of semiconductor material $\mathbf{346_0}$-$\mathbf{346_2}$.

While higher energy implants generally form doped regions at deeper levels (e.g., farther from the surface of the semiconductor material 340) for a given dopant species, they may also lead to an increased level of dopant migration or straggle, such that the region $\mathbf{346_0}$ might be wider than the region $\mathbf{346_1}$ which might be wider than the region $\mathbf{346_2}$. As the spacing between adjacent well structures narrows, isolation characteristics might diminish and might lead to punch-through, or breakdown, between the adjacent well structures. Various embodiments may mitigate such widening of the doped regions of a multi-level well structure. Various embodiments may seek to form well structures having vertical or retrograde profiles.

Figure 4A:
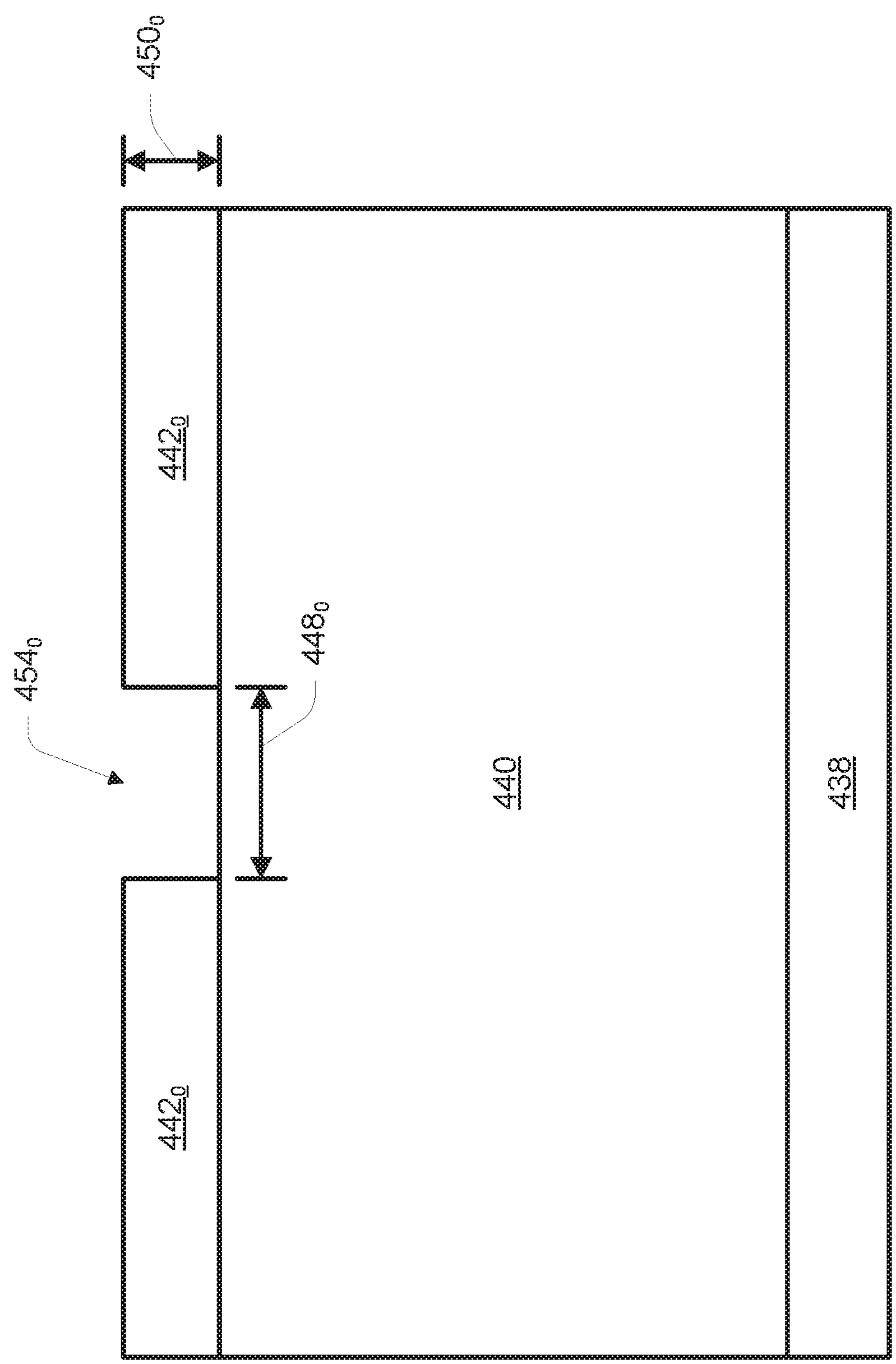
FIGS. 4A-4H depict an integrated circuit structure during various stages of fabrication in accordance with embodiments.

FIGS. 4A-4H depict an integrated circuit structure during various stages of fabrication in accordance with embodiments. FIG. 4A depicts a semiconductor material 440 over a region of semiconductor material 438. The semiconductor materials 438 and 440 may each comprise silicon, such as monocrystalline silicon, or other semiconductor material. The semiconductor material 440 might have a conductivity type that is different than (e.g., opposite of) the conductivity type of the semiconductor material 438. For example, the semiconductor material 438 might have a first conductivity type (e.g., an n-type conductivity) and the semiconductor material 440 might have second conductivity type (e.g., a p-type conductivity). The region of semiconductor material 438 might be formed by implanting a dopant species (e.g., one or more dopant species) into the semiconductor material 440. Alternatively, the semiconductor material 440 might be formed over and subsequent to forming the semiconductor material 438, such as by epitaxial growth, chemical vapor deposition, physical vapor deposition, etc.

A patterned mask $\mathbf{442_0}$ might be formed over the semiconductor material 440. The patterned mask $\mathbf{442_0}$ might have an opening $\mathbf{454_0}$ exposing a portion of the semiconductor material 440 and having a width $\mathbf{448_0}$. The patterned mask $\mathbf{442_0}$ might further have a thickness $\mathbf{450_0}$. As one example, the thickness $\mathbf{450_0}$ might be 3-4 μm, e.g., 3.3 μm. The patterned mask $\mathbf{442_0}$ might represent a patterned photoresist material, or any other material configured to impede (e.g., block) implantation of dopant species.

Photolithographic processes are often used to define a desired pattern in integrated circuit fabrication. In a photolithographic process, a photoresist layer may be formed on the surface of the in-process device. The photoresist layer may contain a photo-sensitive polymer whose ease of removal is altered upon exposure to light or other electromagnetic radiation. To define the pattern, the photoresist layer may be selectively exposed to radiation and then developed to expose portions of the underlying layer. In a positive resist system, the portions of the photoresist layer exposed to the radiation are photosolubilized and a photolithographic mask is designed to block the radiation from those portions of the photoresist layer that are to remain after developing. In a negative resist systems, the portions of the photoresist layer exposed to the radiation are photopolymerized and the photolithographic mask is designed to block the radiation from those portions of the photoresist layer that are to be removed by developing.

Figure 4B:
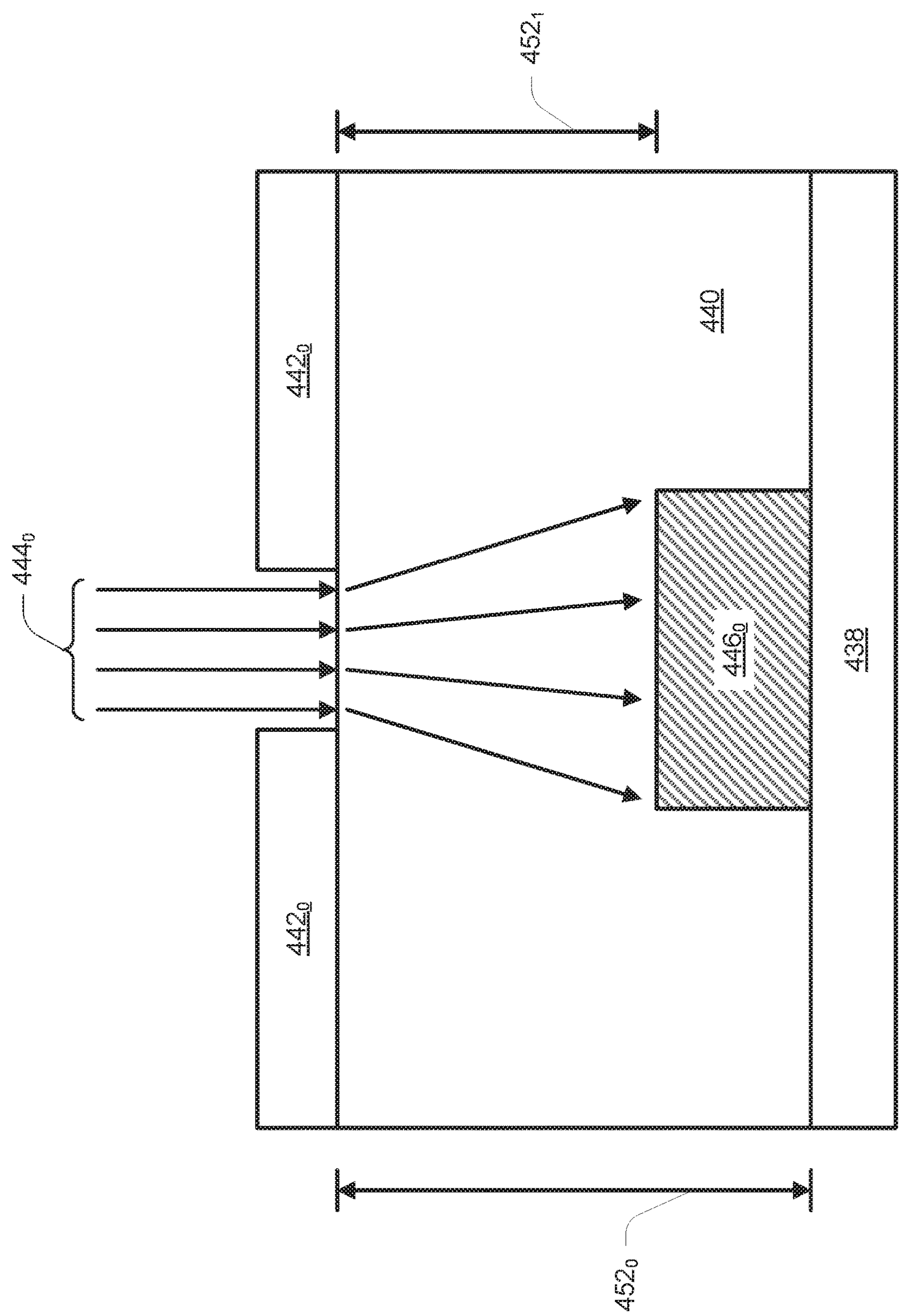

In FIG. 4B, a dopant species might be accelerated (e.g., implanted) into the semiconductor material 440 through the opening $\mathbf{454_0}$. For example, a beam of ions $\mathbf{444_0}$ might be directed at the surface of the semiconductor material 440 to form a region of semiconductor material $\mathbf{446_0}$, which might be in contact with the region of semiconductor material 438. The region of semiconductor material $\mathbf{446_0}$ might have the first conductivity type. Although the region of semiconductor material $\mathbf{446_0}$ is depicted as having a rectangular profile, those of ordinary skill in the art will recognize that the profile shape may generally be more amorphous in nature. The region of semiconductor material $\mathbf{446_0}$ might be formed at a first level within the semiconductor material 440 nominally extending (e.g., extending) from a first depth $\mathbf{452_0}$ from the surface of the semiconductor material 440 (e.g., in contact with the region of semiconductor material 438) to a second depth $\mathbf{452_1}$ (e.g., to at least the second depth $\mathbf{452_1}$) from the surface of the semiconductor material 440.

Figure 4C:
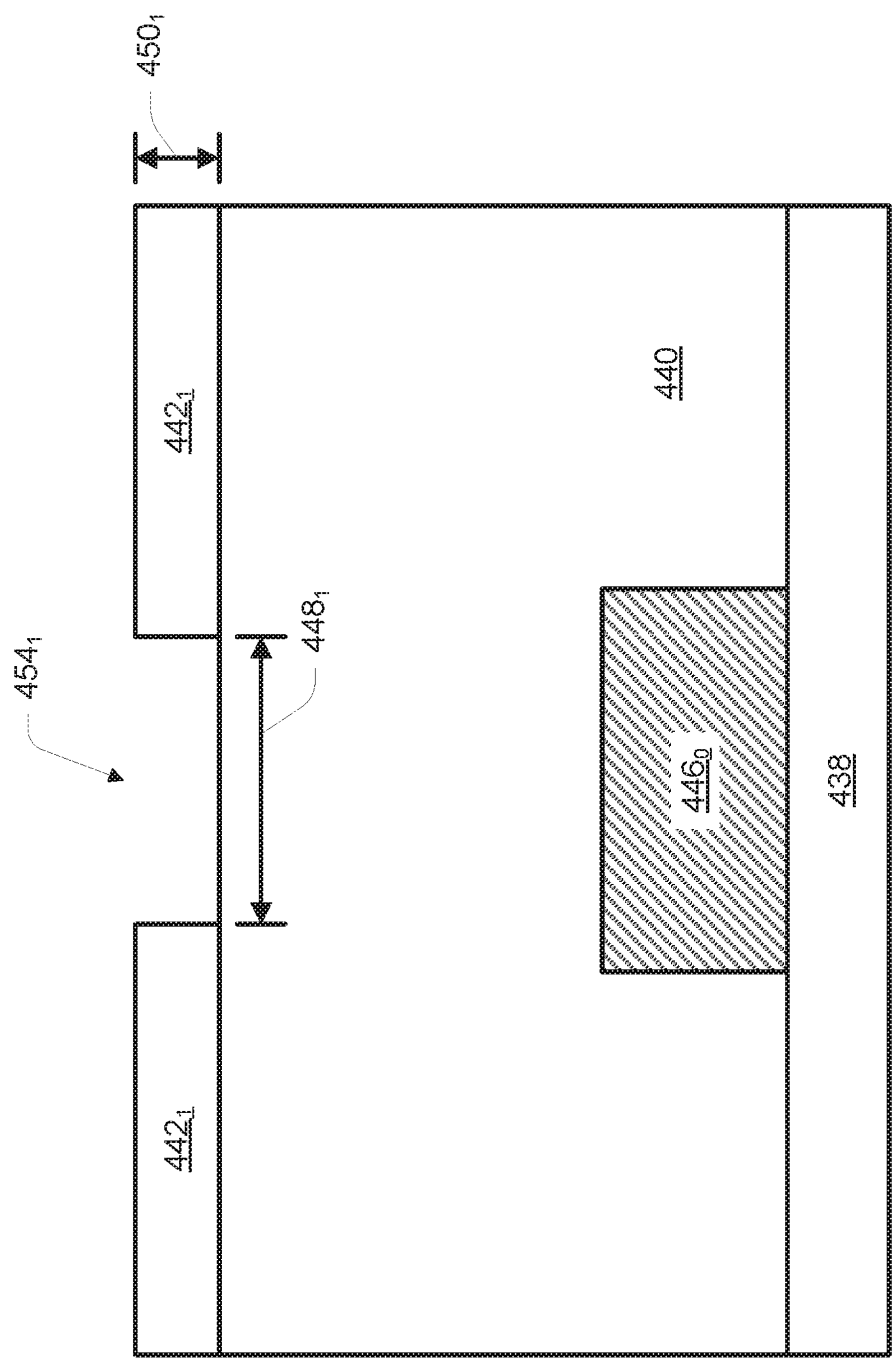

In FIG. 4C, the patterned mask $\mathbf{442_0}$ of FIGS. 4A-4B is subjected to an isotropic removal process, such as an isotropic wet etch, an isotropic dry plasma etch, a dry-strip plasma clean, etc., to form the patterned mask $\mathbf{442_1}$. The patterned mask $\mathbf{442_1}$ might have an opening $\mathbf{454_1}$ exposing a portion of the semiconductor material 440 and having a width $\mathbf{448_1}$. The patterned mask $\mathbf{442_1}$ might further have a thickness $\mathbf{450_1}$. Isotropic removal processes generally remove materials (e.g., uniformly) in all directions of contact, e.g., reducing thicknesses and widening openings of surface materials being removed. Accordingly, the width $448_1$ may be greater (e.g., wider) than the width $448_0$, while the thickness $450_1$ may be less (e.g., narrower) than the thickness $450_0$. As one example, the thickness $450_1$ might be 1.5-2.5 μm, e.g., 2 μm.

Figure 4D:
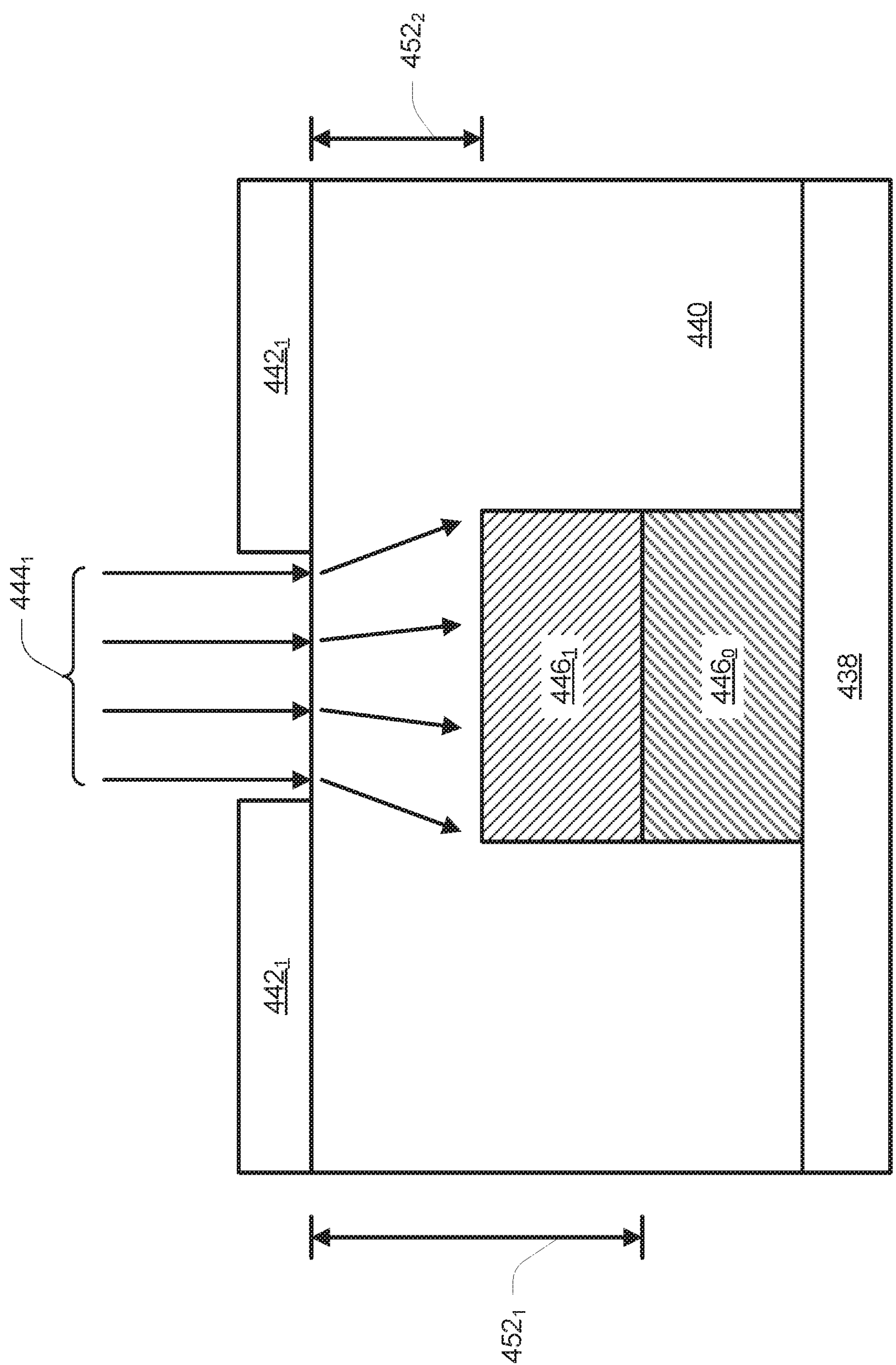

In FIG. 4D, a dopant species might be accelerated (e.g., implanted) into the semiconductor material 440 through the opening $454_1$. For example, a beam of ions $444_1$ might be directed at the surface of the semiconductor material 440 to form a region of semiconductor material $446_1$, which might be in contact with the region of semiconductor material $446_0$. The region of semiconductor material $446_1$ might have the first conductivity type. Although the region of semiconductor material $446_1$ is depicted as having a rectangular profile, those of ordinary skill in the art will recognize that the profile shape may generally be more amorphous in nature. The region of semiconductor material $446_1$ might be formed at a second level within the semiconductor material 440 nominally extending (e.g., extending) from the second depth $452_1$ (e.g., from at least the second depth $452_1$) to a third depth $452_2$ (e.g., to at least the third depth $452_2$) from the surface of the semiconductor material 440.

The dopant species used to form the region of semiconductor material $446_1$ may be the same as, or different than, the dopant species used to form the region of semiconductor material $446_0$, while having a same conductivity type. For example, the dopant species used to form the region of semiconductor material $446_0$ and the region of semiconductor material $446_1$ might both be phosphorus to form regions of n-type conductivity. Alternatively, the dopant species used to form the region of semiconductor material $446_0$ might be phosphorus to form a region of n-type conductivity, while the dopant species used to form the region of semiconductor material $446_1$ might be arsenic to also form a region of n-type conductivity.

Figure 4E:
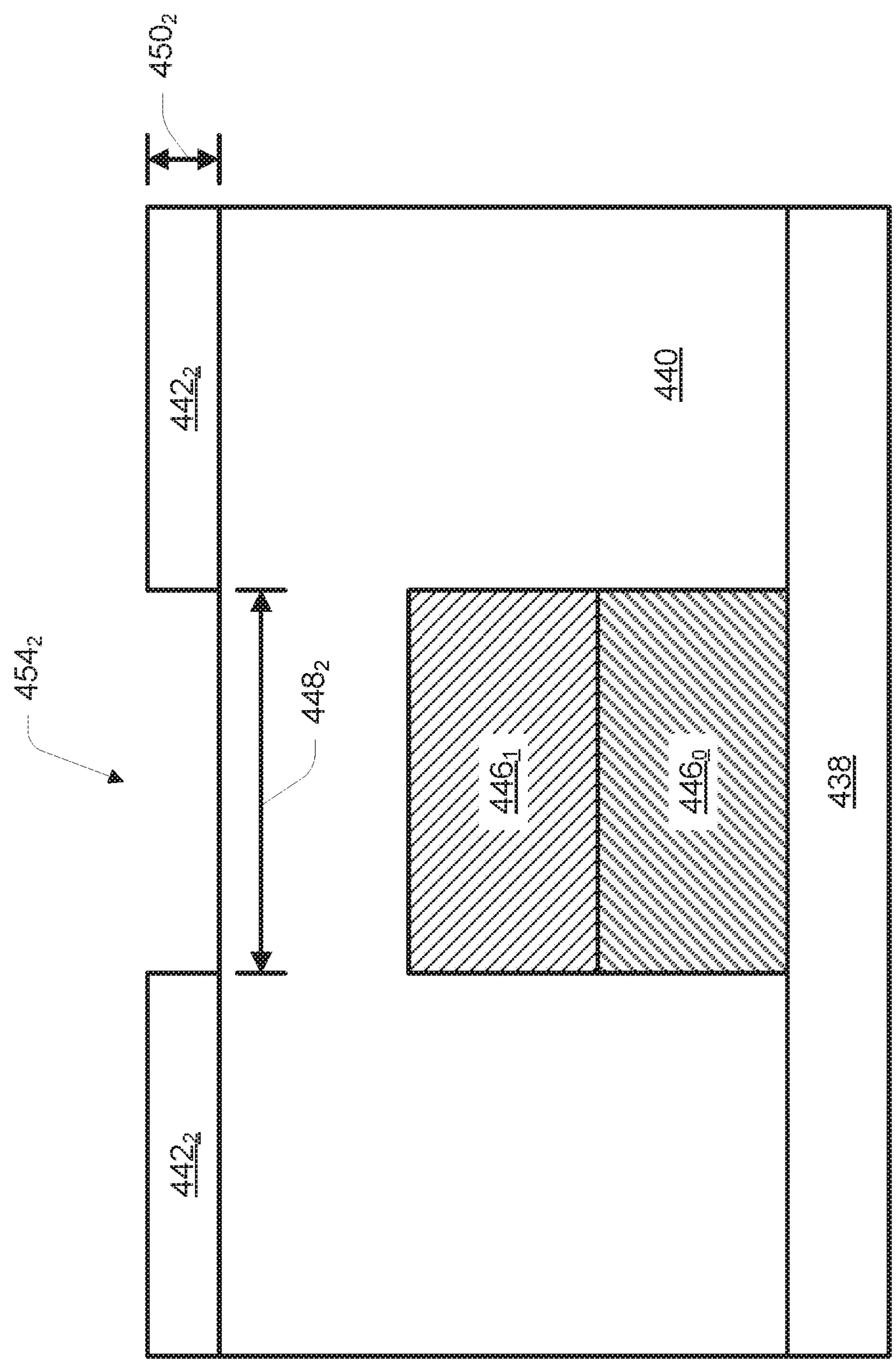

In FIG. 4E, the patterned mask $442_1$ of FIGS. 4C-4D is subjected to an isotropic removal process, such as an isotropic wet etch, an isotropic dry plasma etch, a dry-strip plasma clean, etc., to form the patterned mask $442_2$. The patterned mask $442_2$ might have an opening $454_2$ exposing a portion of the semiconductor material 440 and having a width $448_2$. The patterned mask $442_2$ might further have a thickness $450_2$. The width $448_2$ may be greater (e.g., wider) than the width $448_1$, while the thickness $450_2$ may be less (e.g., narrower) than the thickness $450_1$. As one example, the thickness $450_2$ might be 0.5-1.0 μm, e.g., 0.8 μm.

Figure 4F:
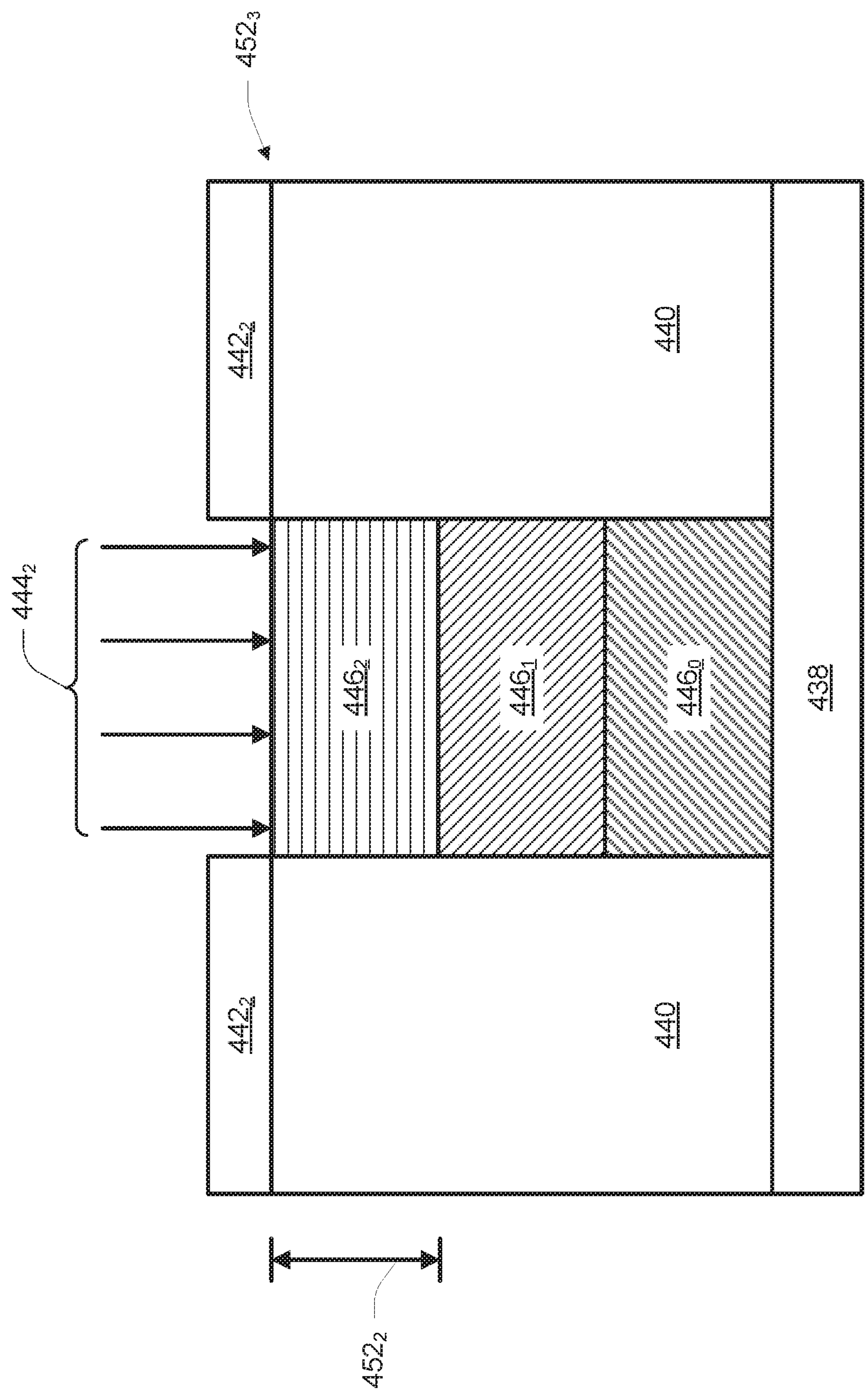

In FIG. 4F, a dopant species might be accelerated (e.g., implanted) into the semiconductor material 440 through the opening $454_2$. For example, a beam of ions $444_2$ might be directed at the surface of the semiconductor material 440 to form a region of semiconductor material $446_2$, which might be in contact with the region of semiconductor material $446_1$. The region of semiconductor material $446_2$ might have the first conductivity type. Although the region of semiconductor material $446_2$ is depicted as having a rectangular profile, those of ordinary skill in the art will recognize that the profile shape may generally be more amorphous in nature. The region of semiconductor material $446_2$ might be formed at a third level within the semiconductor material 440 nominally extending (e.g., extending) from the third depth $452_2$ (e.g., from at least the third depth $452_2$) to a fourth depth $452_3$ from the surface of the semiconductor material 440, which may be coincident with the surface of the semiconductor material 440. The dopant species used to form the region of semiconductor material $446_2$ may be the same as, or different than, the dopant species used to form the region of semiconductor material $446_1$, while having a same conductivity type.

Figure 4G:
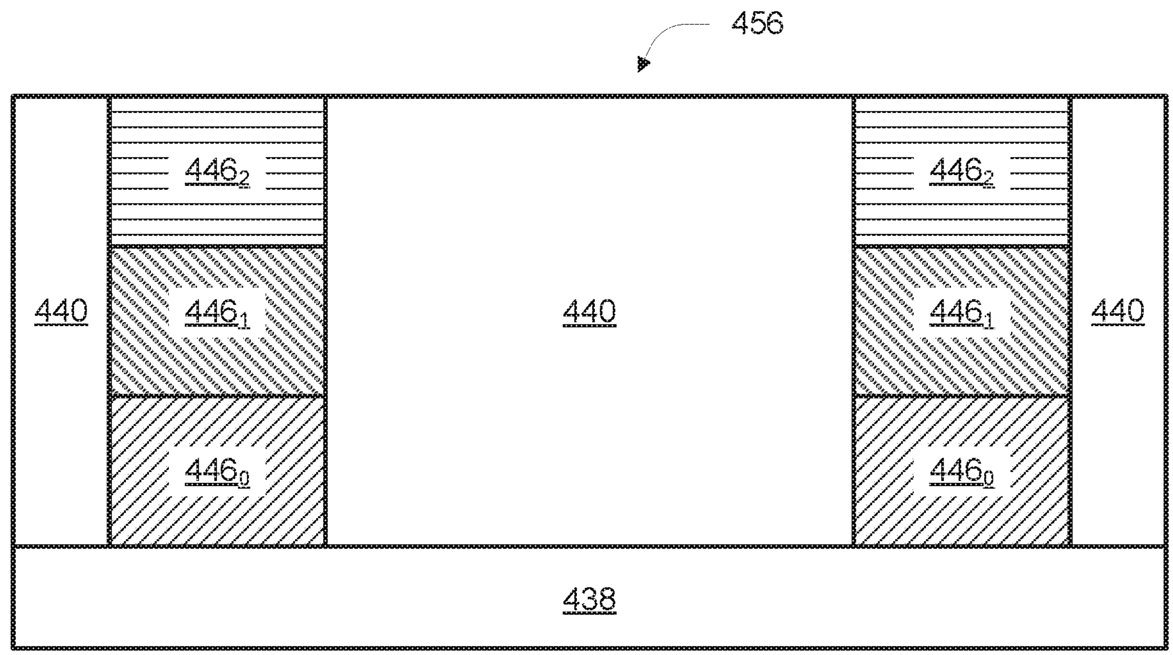
Figure 4H:
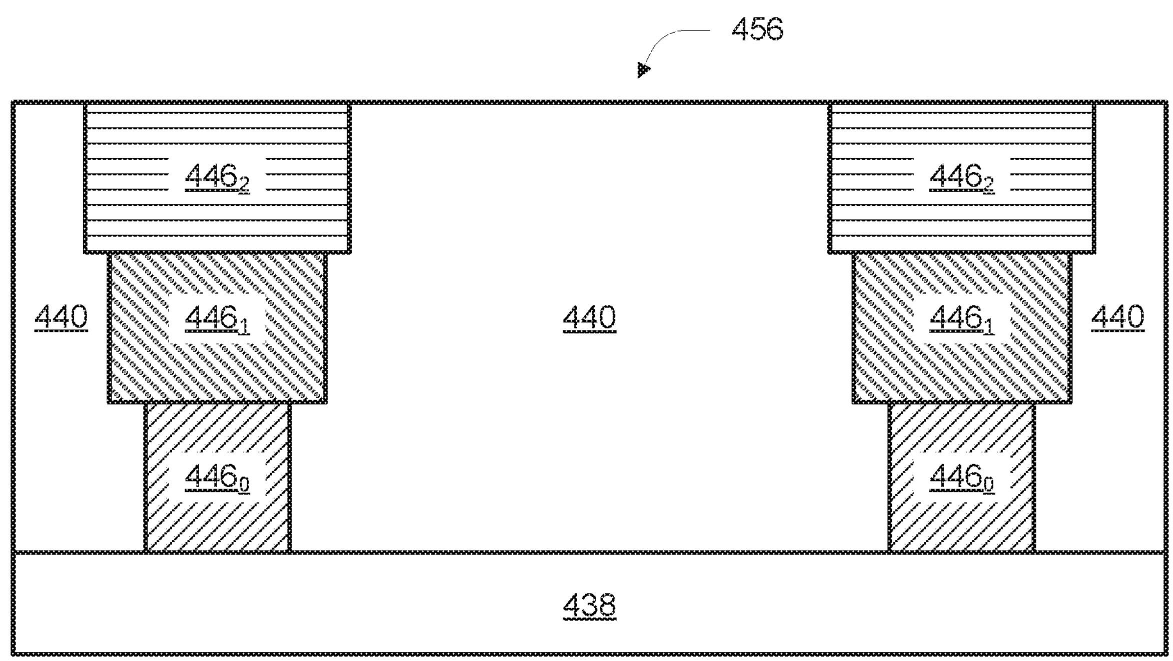

While FIGS. 4A-4F depicted a well structure of a single stack of regions of semiconductor material 446, such well structures would typically be used to form tubs, e.g., enclosing a portion of the semiconductor material 440 (e.g., a well) having the second conductivity type within a tub of material having the first conductivity type. FIGS. 4G and 4H each depict a well 456 in a portion of the semiconductor material 440 that is isolated from adjacent portions of the semiconductor material 440 by regions of semiconductor material 438 and 446 having the first conductivity type. By utilizing the isotropic removal of the patterned mask between the formation of regions of semiconductor material 446 at adjacent levels, a generally vertical profile of the regions of semiconductor material 446 might be generated, such as depicted in FIG. 4G, with widths of each resulting region of semiconductor material being similar (e.g., the same). Additionally, as the risk of punch-through might be more severe at lower levels of the regions of semiconductor material 446, a retrograde profile of the regions of semiconductor material 446 might be generated, such as depicted in FIG. 4H, in order to increase the spacing between adjacent regions of semiconductor material 446 at the lower levels, e.g., by reducing the resulting widths of regions of semiconductor material 446 at lower levels, without affecting the spacing between adjacent regions of semiconductor material near (e.g., at) the surface of the semiconductor material 440. While each region of semiconductor material 446 formed at one level (e.g., for a corresponding range of depths from the surface of the semiconductor material 440) is depicted in FIG. 4H to be wider than each region of semiconductor material 446 formed at a lower level (e.g., for a different corresponding range of depths farther from the surface of the semiconductor material 440), other options might be used. For example, the regions of semiconductor material $446_1$ and $446_2$ might have similar widths, such as shown and described with reference to FIG. 4G, and the region of semiconductor material $446_0$ might have a width less than the width of the region of semiconductor material $446_1$, such as shown and described with reference to FIG. 4H.

By characterizing the implantation of desired dopant species at different levels of the semiconductor material 440, as might be determined experimentally, empirically or through simulation, desired widths of openings 454 could be determined for each desired level to produce the desired profile. Similarly, by characterizing the isotropic removal of the patterned mask 442, as might be determined experimentally, empirically or through simulation, a desired initial thickness could be determined that would permit formation of each of the subsequent desired widths of the openings 454 while maintaining sufficient thickness to impede implantation of dopant species where such is not desired. While three levels of regions of semiconductor material 446 were shown and described with reference to FIGS. 4A-4H, fewer or more levels of regions of semiconductor material 446 might be used in accordance with embodiments.

Different types of circuitry might be formed over the regions of semiconductor material 446 (e.g., regions of semiconductor material $446_2$) versus the well 456. For example, p-type field-effect transistors (pFETs) might be formed in adjacent semiconductor regions $446_2$ (e.g., as part of circuitry to select different blocks of memory cells of an array of memory cells for access), while n-type field-effect transistors (nFETs) might be formed in the well 456. FIGS.

5A-5B provide an example of the use of a region of semiconductor material 446 in a memory.

Figure 5A:
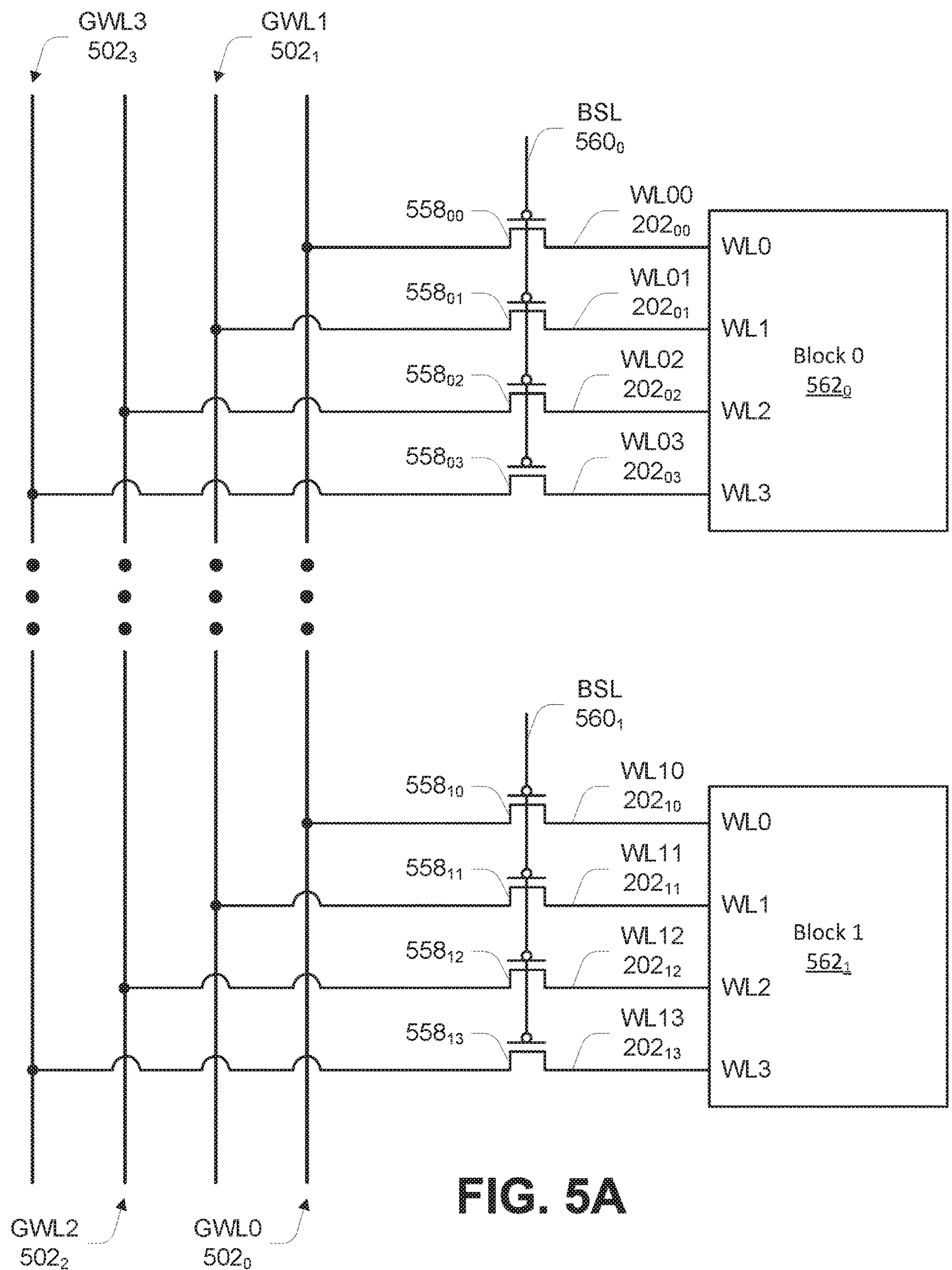
FIG. 5A is a schematic of a portion of an array of memory cells as could be used in a memory device of the type described with reference to FIG. 1.

As referenced with respect to FIG. 2A, local access lines, e.g., word lines 202, may be connected to global access lines in a many-to-one relationship. FIG. 5A is a schematic of a portion of an array of memory cells as could be used in a memory device of the type described with reference to FIG. 1 and depicting this many-to-one relationship between local access lines (e.g., word lines 202) and global access lines (e.g., global word lines 502).

As depicted in FIG. 5A, a plurality of blocks of memory cells 562 may have their local access lines (e.g., word lines 202) commonly selectively connected to a plurality of global access lines (e.g., global word lines 502). A block of memory cells 562 may include a plurality of NAND strings 206 commonly coupled to a particular set of word lines 202. For example, the NAND strings $\mathbf{206}_0$-$\mathbf{206}_M$ of FIG. 2A, or some portion thereof, may represent a block of memory cells 562. Although FIG. 5A depicts only blocks of memory cells $\mathbf{562}_0$ and $\mathbf{562}_1$ (Block 0 and Block 1), additional blocks of memory cells 562 may have their word lines 202 commonly connected to global word lines 502 in a like manner. Similarly, although FIG. 5A depicts only four word lines 202, blocks of memory cells 562 may include fewer or more word lines 202. In applying the structure of FIG. 5A to the array structures of FIGS. 2A-2B, it is clear that there would be N+1 global word lines 502, i.e., GWL $\mathbf{502}_0$ to $\mathbf{502}_N$.

To facilitate memory access operations to specific blocks of memory cells 562 commonly coupled to a given set of global word lines 502, each block of memory cells 562 may have a corresponding set of block select transistors 558 in a one-to-one relationship with their word lines 202. Control gates of the set of block select transistors 558 for a given block of memory cells 562 may have their control gates commonly connected to a corresponding block select line 560. For example, for block of memory cells $\mathbf{562}_0$, word line $\mathbf{202}_{00}$ may be selectively connected to global word line $\mathbf{502}_0$ through block select transistor $\mathbf{558}_{00}$, word line $\mathbf{202}_{01}$ may be selectively connected to global word line $\mathbf{502}_1$ through block select transistor $\mathbf{558}_{01}$, word line $\mathbf{202}_{02}$ may be selectively connected to global word line $\mathbf{502}_2$ through block select transistor $\mathbf{558}_{02}$, and word line $\mathbf{202}_{03}$ may be selectively connected to global word line $\mathbf{502}_3$ through block select transistor $\mathbf{558}_{03}$, while block select transistors $\mathbf{558}_{00}$-$\mathbf{554}_{03}$ are responsive to a control signal (e.g., a common control signal) received on block select line $\mathbf{560}_0$.

Figure 5B:
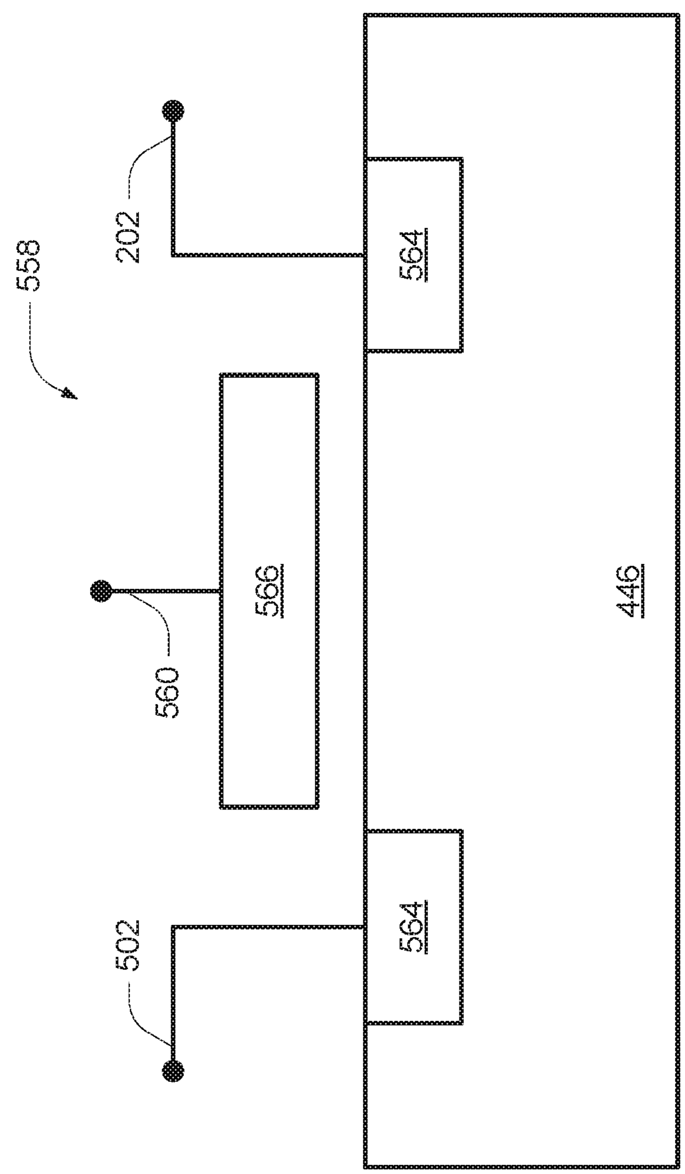
FIG. 5B is a cross-sectional view of a block select transistor of FIG. 4A formed on a portion of the integrated circuit structure of FIG. 3F-3H.

Block select transistors may be high-voltage devices. Such switching devices may require increased isolation. FIG. 5B is a cross-sectional view of a block select transistor 558, having a control gate 566 and source/drain regions 564, wherein the control gate 566 is connected to a block select line 560. The block select transistor 558 may be formed in a region of semiconductor material 446 (e.g., a region of semiconductor material $\mathbf{446}_2$ of FIG. 4F), e.g., after removal of the patterned mask 442. For a high-voltage pFET, the regions of semiconductor material 446 might have an N-level of conductivity to provide a high breakdown voltage, e.g., greater than about 30V.

Figure 6:
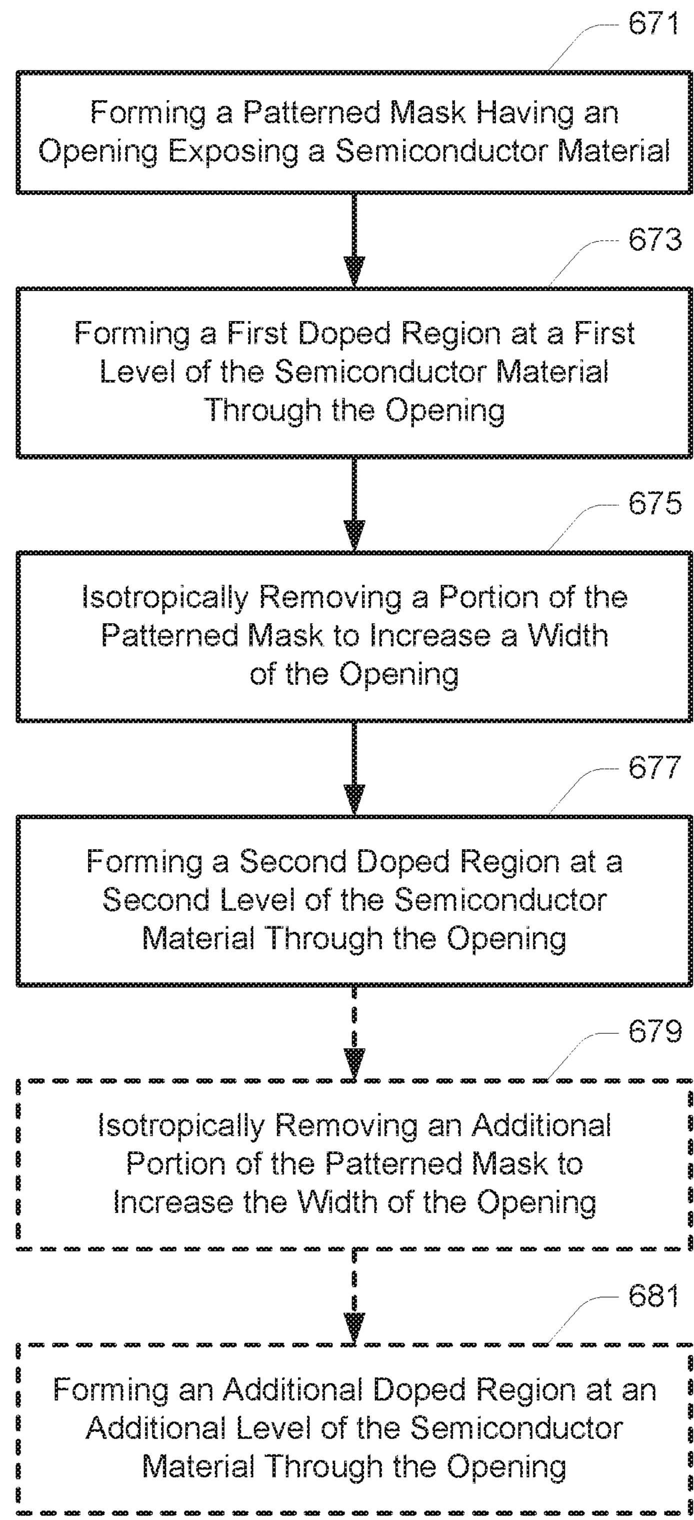
FIG. 6 is a flowchart of a method of forming a portion of an integrated circuit device in accordance with an embodiment.

FIG. 6 is a flowchart of a method of forming a portion of an integrated circuit device in accordance with an embodiment. At 671, a patterned mask might be formed having an opening and exposing a semiconductor material (e.g., a portion of a surface of the semiconductor material). For example, a patterned mask might be formed over (e.g., on) a surface of the semiconductor material. At 673, a first doped region might be formed at a first level of the semiconductor level through the opening. At 675, a portion of the patterned mask might be removed isotropically to increase a width of the opening. And at 677, a second doped region might then be formed at a second level of the semiconductor level through the opening.

For some embodiments, additional doped regions might be formed at additional levels of the semiconductor material. Accordingly, the process might proceed to 679, where an additional portion (e.g., second portion) of the patterned mask might be removed isotropically to increase (e.g., further increase) the width of the opening. Subsequently, at 681, an additional doped region (e.g., third doped region) might be formed at an additional level (e.g., third level) of the semiconductor level through the opening. This processing might be repeated for one or more additional doped regions of semiconductor material.

Figure 7:
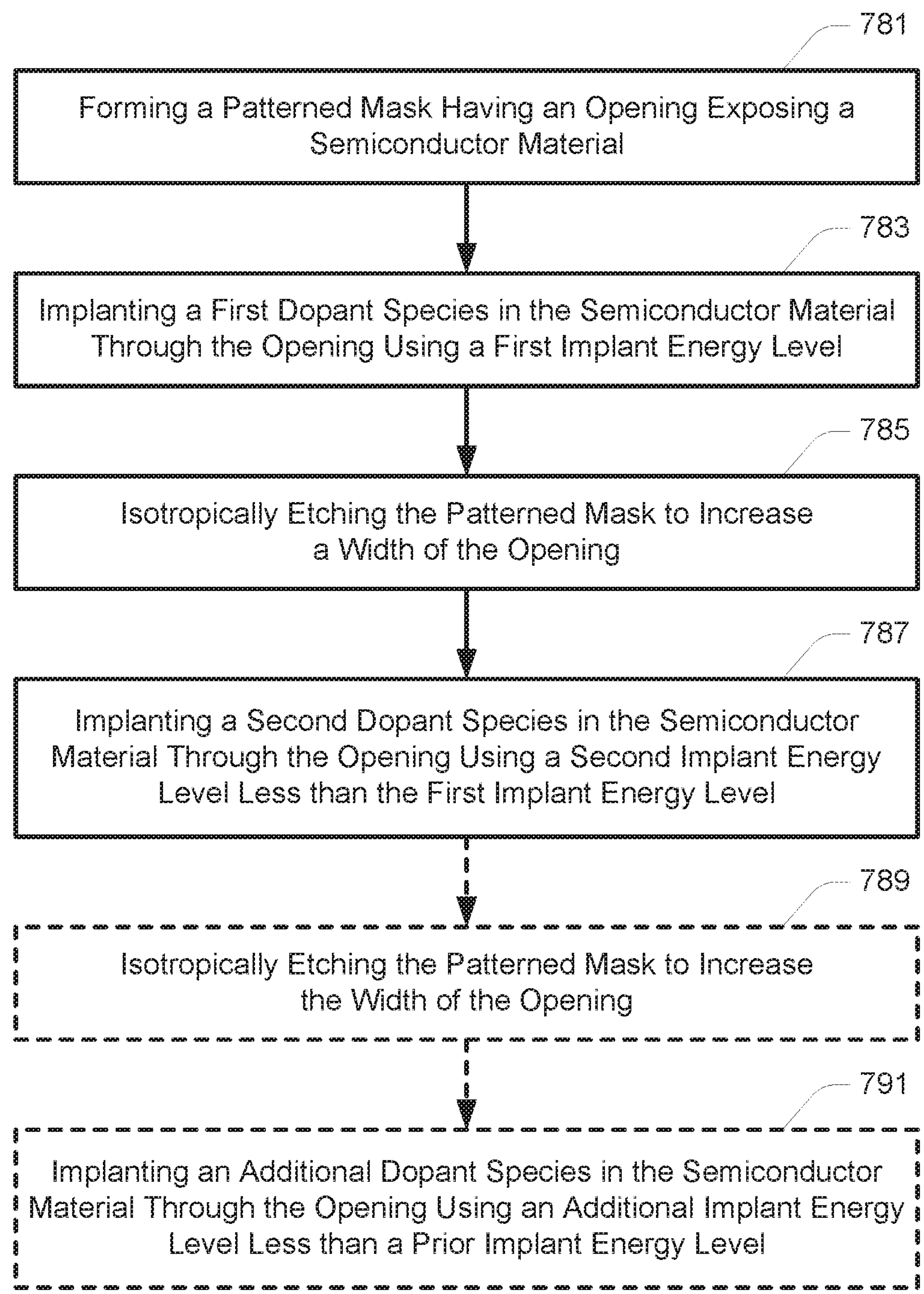
FIG. 7 is a flowchart of a method of forming a portion of an integrated circuit device in accordance with an embodiment.

FIG. 7 is a flowchart of a method of forming a portion of an integrated circuit device in accordance with an embodiment. At 781, a patterned mask might be formed having an opening and exposing a semiconductor material (e.g., a portion of a surface of the semiconductor material). For example, a patterned mask might be formed over (e.g., on) a surface of the semiconductor material. At 783, a first dopant species might be implanted in the semiconductor material through the opening and using a first implant energy level. For example, the first dopant species might be phosphorus and the first implant energy level might be approximately 100 KeV, e.g., 960 KeV.

At 785, the patterned mask might be isotropically etched to increase a width of the opening. And at 787, a second dopant species might be implanted in the semiconductor material through the opening and using a second implant energy level less than the first implant energy level. The second dopant species might be the same as, or different from, the first dopant species. The second dopant species might provide a same conductivity type as the first dopant species. For example, the second dopant species might be phosphorus and the second implant energy level might be approximately 300-400 KeV, e.g., 320 KeV.

For some embodiments, additional doped species might be implanted at different implant energy levels. Accordingly, the process might proceed to 789, where the patterned mask might again be isotropically etched to increase (e.g., further increase) the width of the opening. At 791, an additional dopant species might be implanted in the semiconductor material through the opening and using an additional (e.g., second) implant energy level less than a prior (e.g., the first) implant energy level. The additional dopant species might be the same as, or different from, the prior (e.g., second) dopant species. The additional dopant species might provide a same conductivity type as the prior dopant species. For example, the additional dopant species might be phosphorus and the additional implant energy level might be approximately 100-200 KeV, e.g., 150 KeV. This processing might be repeated for one or more additional doped regions of semiconductor material. The implant energy level selected for implanting a dopant species at the surface of the semiconductor material might be chosen in response to desired electrical properties of circuitry formed in that region of semiconductor material.

Figure 8:
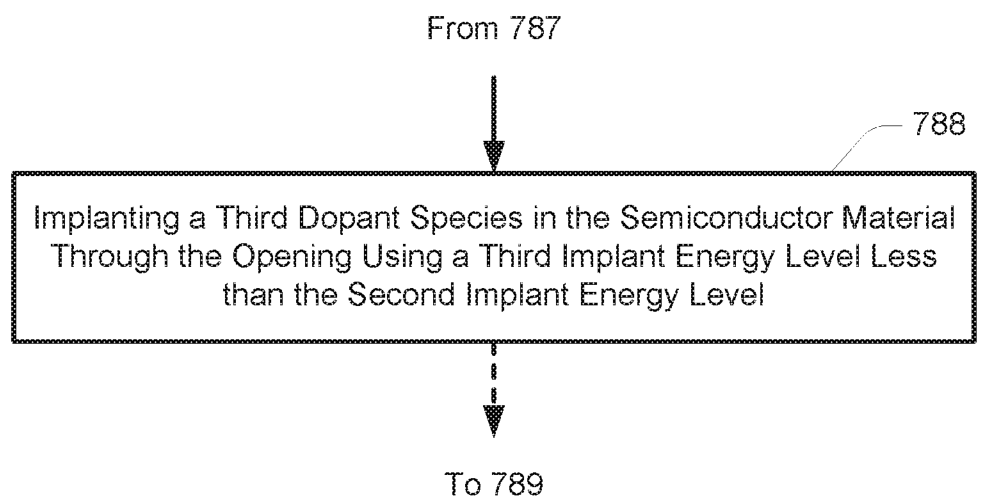
FIG. 8 is a flowchart of a method of forming a portion of an integrated circuit device in accordance with an embodiment.

For some embodiments, dopant species might be implanted through an opening of a particular width at more than one implant energy level, e.g., to increase a range of depth of a resulting doped region of semiconductor material. FIG. 8 is a flowchart of a method of forming a portion of an integrated circuit device in accordance with such an embodiment, as an extension of the method of FIG. 7. For example, proceeding from 787 of FIG. 7, at third dopant species might be implanted in the semiconductor material through the opening and using a third implant energy level less than the second implant energy level. The third dopant species might be the same as, or different from, the second dopant species. The third dopant species might provide a same conductivity type as the second dopant species. For example, the third dopant species might be phosphorus and the second implant energy level might be approximately 100-200 KeV, e.g., 150 KeV. One or more additional dopant species might be implanted at successively lesser energy implant energy levels prior to isotropically etching the patterned mask. The process might then optionally proceed to 789 of FIG. 7.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A method of forming a portion of an integrated circuit, comprising:

forming a patterned mask having an opening and exposing a surface of a semiconductor material;

forming a first doped region at a first level of the semiconductor material through the opening, wherein the first doped region has a particular conductivity type;

isotropically removing a portion of the patterned mask to increase a width of the opening; and after isotropically removing the portion of the patterned mask, forming a second doped region at a second level of the semiconductor region through the opening, wherein the second doped region has the particular conductivity type;

wherein the second level is closer to the surface of the semiconductor material than the first level.

2. The method of claim 1, wherein forming the patterned mask comprises forming a patterned photoresist material.

3. The method of claim 1, wherein forming the first doped region comprises implanting a first dopant species having the particular conductivity type in the semiconductor material, and wherein forming the second doped region comprises implanting a second dopant species having the particular conductivity type in the semiconductor material.

4. The method of claim 3, wherein implanting the second dopant species in the semiconductor material comprises implanting a same dopant species as the first dopant species.

5. The method of claim 3, wherein implanting the first dopant species in the semiconductor material and implanting the second dopant species in the semiconductor material comprises implanting the first dopant species in the semiconductor material using a first implant energy level and implanting the second dopant species in the semiconductor material using a second implant energy level less than the first implant energy level.

6. The method of claim 5, wherein isotropically removing the portion of the patterned mask to increase the width of the opening comprises isotropically etching the patterned mask.

7. The method of claim 1, wherein forming the first doped region having the particular conductivity type at the first level of the semiconductor material comprises forming the first doped region having a first conductivity type in the semiconductor material having a second conductivity type different than the first conductivity type.

8. The method of claim 7, wherein forming the first doped region having the first conductivity type in the semiconductor material having the second conductivity type different than the first conductivity type comprises forming the first doped region having the first conductivity type in the semiconductor material having the second conductivity type opposite the first conductivity type.

9. The method of claim 8, wherein forming the first doped region having the first conductivity type in the semiconductor material having the second conductivity type opposite the first conductivity type comprises forming the first doped region having an n-type conductivity in the semiconductor material having a p-type conductivity.

10. The method of claim 1, further comprising:

after forming the second doped region at the second level of the semiconductor region through the opening, isotropically removing an additional portion of the patterned mask to increase the width of the opening; and after isotropically removing the additional portion of the patterned mask, forming an additional doped region at an additional level of the semiconductor region through the opening, wherein the additional doped region has the articular conductivity type.

11. A method of forming a portion of an integrated circuit, comprising:

forming a patterned mask having an opening and exposing a surface of a semiconductor material;

implanting a first dopant species in the semiconductor material through the opening and using a first implant energy level, wherein the first dopant species has a particular conductivity type;

isotropically etching the patterned mask to increase a width of the opening; and after isotropically etching the patterned mask, implanting a second dopant species in the semiconductor material through the opening and using a second implant energy level less than the first implant energy level, wherein the second dopant species has the particular conductivity type.

12. The method of claim 11, further comprising:

after implanting the second dopant species in the semiconductor material, implanting a third dopant species in the semiconductor material through the opening and using a third implant energy level less than the second implant energy level, wherein the third dopant species has the particular conductivity type.

13. The method of claim 12, further comprising implanting the third dopant species without isotropically etching the patterned mask between implanting the second dopant species and implanting the third dopant species.

14. The method of claim 11, further comprising:

after implanting the second dopant species in the semiconductor material, isotropically etching the patterned mask to increase a width of the opening; and after isotropically etching the patterned mask, implanting an additional dopant species in the semiconductor material through the opening and using an additional implant energy level less than a prior implant energy level, wherein the additional dopant species has the particular conductivity type.

15. The method of claim 14, wherein implanting the additional dopant species in the semiconductor material through the opening and using the additional implant energy level less than the prior implant energy level comprises implanting a third dopant species in the semiconductor material through the opening and using a third implant energy level less than the second implant energy level.

16. The method of claim 11, wherein implanting the first dopant species comprises implanting a dopant species having a conductivity type different than a conductivity type of the semiconductor material.

17. The method of claim 11, wherein implanting the first dopant species and implanting the second dopant species comprises implanting a same dopant species for the first dopant species and the second dopant species.

18. The method of claim 11, wherein implanting the first dopant species comprises implanting ions of an element selected from a group consisting of arsenic, antimony, phosphorus and boron.

19. A method of forming a portion of memory, comprising:

forming a patterned mask having an opening and exposing a surface of a semiconductor material;

forming a first doped region at a first level of the semiconductor material through the opening, wherein the first level extends from a first depth from the surface of the semiconductor substrate to a second depth from the surface of the semiconductor material, and wherein the second depth is closer to the surface of the semiconductor material than the first depth;

isotropically removing a portion of the patterned mask to increase a width of the opening;

after isotropically removing the portion of the patterned mask, forming a second doped region at a second level of the semiconductor region through the opening, wherein the second level extends from the second depth from the surface of the semiconductor substrate to a third depth from the surface of the semiconductor substrate, and wherein the third depth is closer to the surface of the semiconductor material than the second depth;

isotropically removing a second portion of the patterned mask to increase a width of the opening;

after isotropically removing the second portion of the patterned mask, forming a third doped region at a third level of the semiconductor region through the opening, wherein the third level extends from the third depth from the surface of the semiconductor substrate to a fourth depth from the surface of the semiconductor substrate, and wherein the fourth depth is closer to the surface of the semiconductor material than the third depth;

after forming the third doped region, removing the patterned mask; and forming a transistor on the third doped region, wherein the transistor is connected between an access line of a block of memory cells of an array of memory cells of the memory and a global access line of the memory.

20. The method of claim 19, wherein forming the second doped region comprises forming the second doped region having a width greater than a width of the first doped region.

* * * * *